United States Patent [19]

Audoin et al.

[11] Patent Number: 4,543,564
[45] Date of Patent: Sep. 24, 1985

[54] INTERFERENCE SUPPRESSION APPARATUS FOR A CAPACITIVE KEYBOARD

[75] Inventors: Marcel Audoin, Seyssinet; Jean-Marc Fedeli, Saint Egreve; Robert Poujois, Sinard, all of France

[73] Assignee: Commissariat a l'Energie Atomique, Paris, France

[21] Appl. No.: 362,290

[22] Filed: Mar. 26, 1982

[30] Foreign Application Priority Data

Apr. 3, 1981 [FR] France ................................ 81 06757
Apr. 3, 1981 [FR] France ................................ 81 06758

[51] Int. Cl.⁴ ................................................ G06F 3/02
[52] U.S. Cl. ......................... 340/365 C; 200/DIG. 1; 340/365 S; 361/287
[58] Field of Search ............... 340/365 S, 365 C, 712; 200/DIG. 1, 280, 287, 288; 400/479.1

[56] References Cited

U.S. PATENT DOCUMENTS

| | | | |
|---|---|---|---|
| 4,145,748 | 3/1979 | Eichelberger | 340/365 C |
| 4,211,915 | 7/1980 | Miller | 340/365 C |
| 4,257,117 | 3/1981 | Besson | 340/365 C |
| 4,291,303 | 9/1981 | Cutler | 340/365 C |
| 4,305,135 | 12/1981 | Dahl | 340/365 C |

FOREIGN PATENT DOCUMENTS 2822847 11/1979 Fed. Rep. of Germany.
2397696 2/1979 France.

Primary Examiner—James J. Groody
Attorney, Agent, or Firm—Kerkam, Stowell Kondracki & Clarke

[57] ABSTRACT

Apparatus for suppressing interference in a capacitive keyboard. Unconditioned operating signals from receiving lines are passed into a subtractor, which establishes the difference between the signal present on a reference line in the keyboard and supplies, at the output, a conditioned operating signal which is free from any unwanted electromagnetic component which may have entered the structure. In addition, in order to determine which of several keys is supplying the highest signal, operating signals corresponding to particular receiving lines are scanned in sequence to determine which has the highest amplitude. As the operating signal corresponding to each successive key is scanned, its voltage is compared with a previously-stored voltage for an earlier-scanned key. If a higher voltage is detected, the voltage and key address are stored in place of the previously-stored values.

5 Claims, 8 Drawing Figures

INTERFERENCE SUPPRESSION APPARATUS FOR A CAPACITIVE KEYBOARD

BACKGROUND OF THE INVENTION

The present invention relates to capacitive keyboards which, through the presence of a finger on a sensitive key, enable a given order or instruction to be carried out. Such keyboards are being used with increasing frequency, both for industrial and scientific applications, as well as in places open to the general public and even in electrical domestic appliances.

The known operation of such a capacitive keyboard will firstly be described in order to provide a better definition of the problem solved by the invention. Static capacitive keyboards in general terms make use of the fact that the presence of the user's finger in the vicinity of one or more conductive fittings produces electrical capacitances between the finger and the fittings and consequently modifies the existing capacitances between the said fittings.

As can be seen in a diagrammatic manner in FIG. 1, such known keyboards generally comprise sensitive keys G, each of which is associated with a pair of underlying electrodes, namely on the one hand a transmitting or emitting electrode A sequentially excited by an alternating signal supplied by a transmitting line X and on the other hand a receiving electrode B, capacitively coupled to the emitting electrode A by the corresponding sensitive key D. A receiving line Y collects on the receiving electrode B the variations in the amplitude of the alternating signal under the effect of the possible presence of the user's finger 1 in the vicinity of key G.

Fig. 2 shows the equivalent circuit diagram of such a key and it is possible to see input line X, output line Y and three capacitances $C_1$, $C_1'$ and $C_2$. Capacitance $C_1$ represents the capacitance between electrode A and electrode G. $C_1'$ represents the capacitance between electrode G and electrode B, and $C_2$ represents the direct capacitive coupling between electrode A and electrode B. The presence of the user is diagrammatically indicated by a branch 2 between the point common to capacitances $C_1$ and $C_1'$ and earth. The branch 2 comprises a first capacitor 3 with a capacitance close to 4 picofarads for representing the user's finger and a capacitance 4 of approximately 60 picofarads for representing the capacitance of the user's body compared with earth. Thus, switch I diagrammatically indicates the presence or absence of the user's finger 1 on key G. The above information is based on the experimental finding that the body of a man can be represented by an electrical conductor which, compared with earth, has an average capacitance of approximately 60 picofarads when the man is wearing insulating shoes. When the finger of a user approaches the sensitive key G, it creates with the latter a capacitance which can vary between 2 and 5 picofarads, particularly as a function of whether or not gloves are worn, and the capacitive keyboard is responsible for detecting the presence of this capacitance.

FIG. 2 also shows a load impedance Z located between the receiving line Y and earth, said impedance Z diagrammatically representing the measuring electronics. In known applications of such capacitive keyboards, the two possible positions of switch I are detected by measuring the voltage collected at the terminals of Z, or the current in impedance Z, or the phase displacement between the transmitter signal at the input and the receiver signal at the output. In general terms, the presence of the user's finger corresponding to a derivation of the current by line 2, consequently leads to a reduction in the voltage on line Y due to the fact that the impedance increases between input X and output Y. It is therefore readily apparent that by examining the preceding variations on impedance Z at the output of receiving line Y, it is possible to determine in each case on which of the sensitive keys G of the capacitive keyboard has been placed the user's finger 1.

The description of the prior art will be completed by giving a few details on the way in which the different sensitive keys and transmitting and receiving electrodes of the same capacitive keyboard are connected to the outside. The easiest design arrangement for such connections is to provide a transmitting line for each trasmitting electrode and a receiving line for each receiving electrode, in which case the diagram of FIG. 2 is repeated the same number of times as there are sensitive keys G in the keyboard, However, it is clear that in the case of a relatively large keyboard this procedure leads to a very high number of connections and it is very difficult to house them in the same keyboard construction. Thus, a matrix-form supply and reading is frequently used, the different transmitting electrodes A and receiving electrodes B being distributed at the apex of a rectangular matrix in the manner indicated in FIG. 3. The various electrodes A and B are arranged in the form of a matrix network having inputs $X_1, X_2, \ldots X_j$ for each column and outputs $Y_1, Y_2, \ldots Y_i$ for each line. FIG. 3 is limited to the electric circuit diagram of transmitting electrodes A and receiving electrodes B. The various sensitvie keys G are not shown and are considered to be outside the plane of the drawing above each of the paris of electrodes A and B. For generating and reading the signals from the keyboard, a sequential alternating power supply is used, reaching each column $X_j$ in successive manner in the form of pulses supplying simultaneously all the electrodes $A_{ij}$ corresponding to the same predetermined value of j. The output signal is found by determining which of the lines $Y_i$ has a signal reduction. When this has been done, it is clear that it is key (i, j) which has been actuated if at the same time it is column $X_{ij}$ which has been excited by the alternating sequential pulse train. The main interest of this type of matrix keyboard is obviously the reduction in the number of wires emanating therefrom for supplying and reading the orders or instructions which it receives.

It is even possible for certain capacitive keyboards to have transmitting and receiving electrodes which are merely in the form of small metal strips constituted by the conductors of the matrix and whose crossing provides the two electrodes of each key.

It is pointed out that the interference suppression apparatus according to the invention can also be used in the case of such capacitive keyboards, whose electrodes are no longer individually specified. In the same way the capacitive keyboards of various known types, e.g. having depressable or static keys fall within the scope of the invention.

One of the most important qualities sought in capacitive keyboards is their sensitivity, which must be as high as possible in order to obtain an unambiguous response to each contact with the user's finger. However, unless special precautions are taken, there are a certain number of obstacles which prevent this from being realized.

Thus, in certain cases the users may be wearing insulating gloves, which greatly reduce the capacitance added by the finger and on the other hand unless considerable care is taken it is easy to simultaneously influence several adjacent keys, so that there are considerable doubts regarding the true intentions of the user. Moreover, it is necessary to be able to recognize a release signal with the minimum possiblity of error and even in the case of a relatively large amount of undesired background noise. However, such electromagnetic interference coming from various sources such as radio or television broadcasts, certain high voltage installations of the railways or electricity authorities and various other influencing loads can very easily swamp the useful signal in a large amount of background noise making it very problematical to interpret the release or tripping state of a capacitive keyboard.

BRIEF SUMMARY OF THE INVENTION

The problem of the present invention is a capacitive keyboard with an interference-suppressing construction, so that it is possible to systematically overcome by using very simple means any unwanted signal received by the keyboard.

Therefore the present invention relates to an apparatus for the suppression of interference in a capacitive keyboard of the type comprising in per se known manner on the outer surface accessible to the user a series of sensitive keys, each of which is associated with a pair of underlying electrodes, namely on the one hand a transmitting electrode sequentially excited by an alternating signal supplied by a transmitting line and on the other hand a receiving electrode capacitively coupled to the transmitting electrode by the corresponding sensitive key and on which a receiving line collects the amplitude variations of the alternating signal under the effect of the possible presence of the finger of a user on said sensitive key, wherein the signals from the receiving lines are passed into a subtracter, which establishes the difference compared with the signal present on a reference line in the keyboard and, at the output, supplies an operating signal free from the unwanted electromagnetic component which has been able to enter the structure.

The operation of the apparatus according to the invention is based on the fact that the surface of the generally used capacitive keyboards is suffficiently small to accept that electromagnetic interference from the outside simultaneously reaches all the electrodes of the keyboard. Thus, on establishing the difference between the unconditioned operating signal present on a receiving line and the signal present at the same time on a reference line within the keyboard, it is possible to obtain at the output of a subtracter a conditioned operating signal free from any unwanted electromagnetic component.

According to the invention the reference line used can be of various types, but it is always either a receiving line forming part of the structure, or a combination of such lines.

This is an essential difference compared with the structure described in French Pat. No. 2 397 696 in which, for monitoring the ignition or extinction state of the tops of the matrix of an electroluminescent panel, a reference line is used which is independent of the matrix and which does not function in the same way as the other lines. Moreover, this French patent relates to the compensaton of a systematic error within the display panel, due to the polarizing current passing through the thin electroluminescent layer and constituting a variable reference threshold. However, in the present invention the existing structure is used for suppressing random, external interference.

According to a first embodiment, the reference line is merely the second receiving line of the actual capacitive keyboard.

Acccording to a second embodiment of the apparatus according to the invention, the reference line is connected to a circuit processing a signal resulting from the combination of a plurality of signals simultaneously collected on several receiving lines of the keyboard. In this way a possible reference interfering signal is obtained corresponding to the "mean value" of the interfering signals received on the receiving lines in question.

According to another variant of the keyboard according to the invention, the two scanning and reference receiving lines are two adjacent receiving lines of a keyboard operated in accordance with a matrix structure. This procedure has the interest of investigating the reference signal in the immediate vicinity of the receiving line in question by an operating signal, which increases the chances of detecting an unwanted or interfering signal.

According to an embodiment of the apparatus according to the invention, each line of transmitting electrodes has at the output an operational amplifier connected in current integrator form having a high open loop amplification factor of approximately 10,000 to 50,000 and looped on to itself by a negative feedback circuit or the RC type. Each amplifier is followed by two threshold circuits $\pm V_o$, whose outputs are connected to the input of an OR-circuit supplying a signal characterizing the presence of interference of amplitude $>V_o$, which is used for blocking the operation of the keyboard throughout the duration of the interference.

The variant of the interference suppression apparatus is very useful for overcoming very high voltage interference (e.g. several thousand volts), which can be produced by electrostatic charges or by high voltage circuit breaking operations. Such very high amplitude interference is dangerous for the electronics of the keyboard and may saturate or even destroy the latter, whilst causing unwanted tripping or release effects.

According to another interesting variant of the invention in order to additionally investigate the key supplying the highest signal during a release detection, a voltage proportional to the capacitance variation caused by the presence of a user's finger in the vicinity of the operated key is stored with it address and then compared with voltage from other adjacent keys in such a way that if a higher amplitude voltage is detected it is automatically stored in place of the preceding voltage. This procedure makes it possible to solve the problem of the ambiguities which may occur when a user has inadvertently touched several keys at once.

To this end the keyboard according to the invention comprises a device for the sequential scanning of the receiving electrodes, each output receiving line of the keyboard then suppling at the output an analog signal corresponding to each key successively, an amplifier for said signal, an analog memory for the amplified signal followed by a voltage comparator, an address memory receiving the coordinates of each key examined by the sequential scanning device and a control line of a first switch located between the output of the amplifier and the analog memory and a second switch connecting the sequential scanning device and the address memory, said control line being under the orders of the output signal of the comparator.

According to the invention the interference-suppressed capacitive keyboard can have an improved structure, wherein it comprises two insulating layers assembled by adhesion, the outer face of the first carrying the sensitive keys G and elsewhere an earthed conductive shield, whilst the outer face of the second carries the receiving electrodes and lines, separating electrodes and their supply lines, whilst its deepest face carries the transmitting electrodes and lines, separating electrodes and an earthed conductive shield.

In this structure, the action of the two upper and lower earthed shields reinforces the protection against external interference already provided by the presence of the reference line and the earthed separating electrodes substantially cancel out the unwanted direct coupling capacitance between electrodes A and B without this reducing the useful signal of the keyboard.

BRIEF DESCRIPTION OF THE DRAWINGS

The invention is described in greater detail hereinafter relative to non-limitative embodiments and the attached drawings, wherein show (FIG. 1 to 3 having already been described).

DETAILED DESCRIPTION OF THE PREFERED EMBODIMENTS

Figure 1:
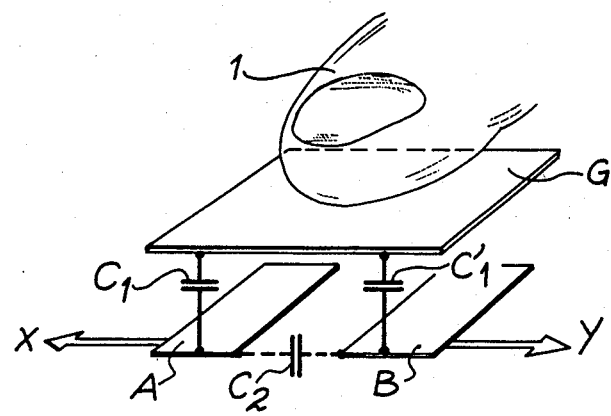
Figure 2:
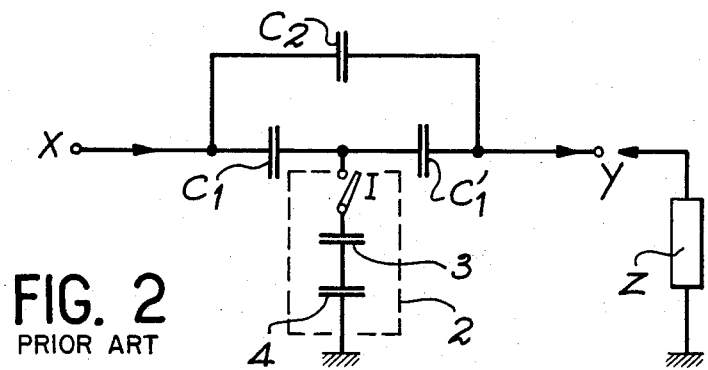
Figure 3:
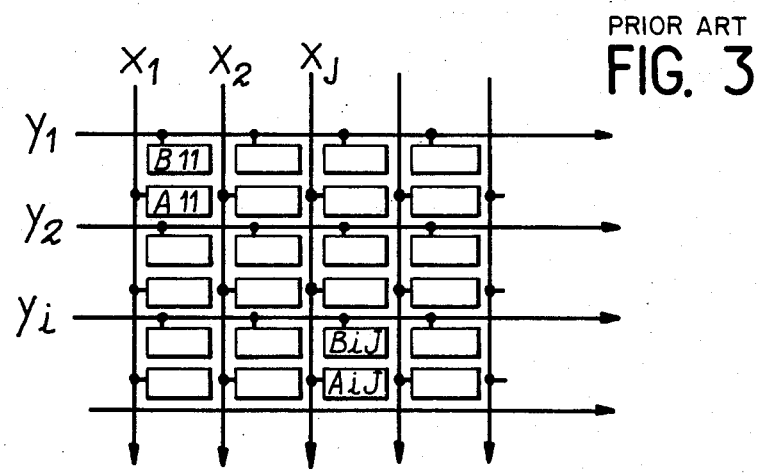
Figure 4:
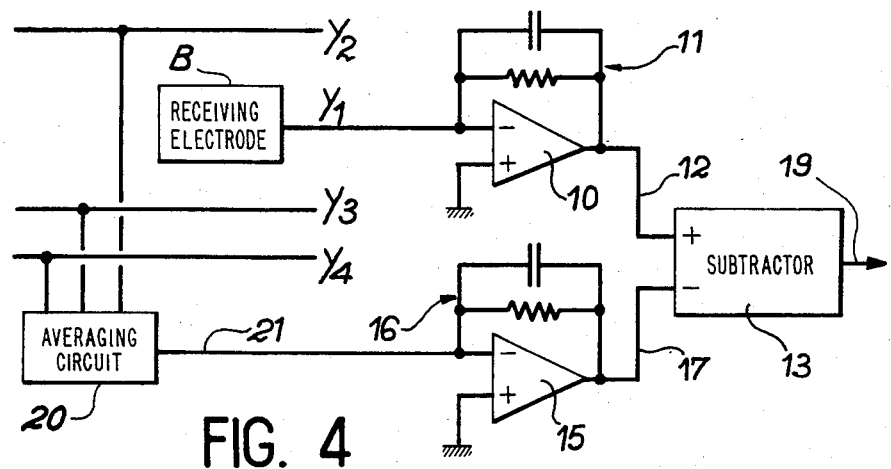
Fig. 4 the circuit diagram of the apparatus according to the invention in the case where the reference line used emanates from a circuit combining several signals collected on several receiving lines.

FIG. 4 shows a receiving electrode B and the corresponding receiving line $Y_1$ supplying operational amplifier 10. The latter is connected in current integrator form and is looped on itself by the RC-type negative feedback circuit 11. Receiving line $Y_1$ enter amplifier 10 via the negative input like the negative feedback circuit 11. The positive input is connected to earth. Output 12 of amplifier 10 is connected to one of the inputs of a subtracter 13. Accorcing to the invention a reference line 21 in the keyboard is connected to the negative input of a second operational amplifier 15, which is also connected in current integrator form and is looped on itself by a negative feedback circuit 16. Output 17 of operational amplifier 15 is connected to the second input of subtracter 13.

In the embodiment of FIG. 4, line $Y_1$ and receiving electrode B supply amplifier 10 and the reference signal is processed on the basis of a circuit 20, which collects the signals present on the three other receiving lines $Y_2$, $Y_3$ and $Y_4$ and forms the mean value thereof. The second amplifier 15 is supplied with this mean value for the signals via line 21. It is easy to understand the operation of the apparatus diagrammatically described in FIG. 4. The output signal, which it is desired to process on receiving line $Y_1$ is unconditioned in that it may possibly be mixed with a component representing electromagnetic interference which is then also present with the same intensity on reference line 21. After amplification in amplifiers 10 and 15 and subtraction in subtracter 13, said interference component is eliminated and at the output 19 of subtracter 13 all that is left is the useful signal for the operation of the keyboard, which useful signal may be viewed as a conditioned signal.

Figure 5:
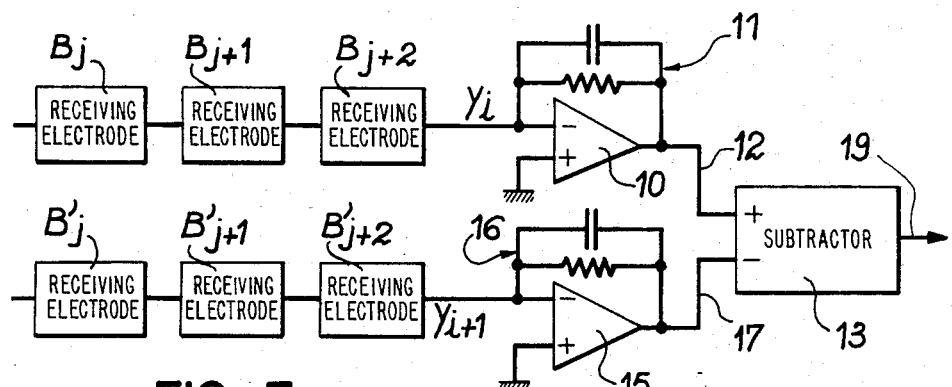
FIG. 5 the apparatus according to the invention applied in the case where the two receiving lines used for carrying out the subtraction of the signals are two adjacent receiving lines of the same matrix structure.

The embodiment of FIG. 5 relates to the apparatus according to the invention applied to the operation of the keyboard using a matrix structure. Therefore two receiving lines $Y_i$ and $Y_{i+1}$ are shown, which respectively supply the same two voltage amplifiers 10 and 15 as in the embodiment of FIG. 4. In FIG. 5 it is also possible to see a certain number of receiving electrodes, namely six such electrodes and designated for line $Y_i B_j$, $B_{j+1}$ and $B_{j+2}$ and for line $Y_{i+1} B_j'$, $B_{j+1}'$ and $B_{j+2}'$. The operation of the apparatus of FIG. 5 is comparable to that of FIG. 4 in the sense that the output signals present on receiving lines $Y_i$ and $Y_{i+1}$ are conditioned in that they may possibly contain the same interference component which, after amplification and subtraction, is completely eliminated at output 19 of the system. In this embodiment the reference line used is the receiving line $Y_{i+1}$ directly adjacent to scanning line $Y_i$, so that there is a maximum likelihood that an unwanted signal from the outside has influenced in a substantially identical manner the two series of transmitting electrodes $B_j$ and $B_j'$.

Figure 6:
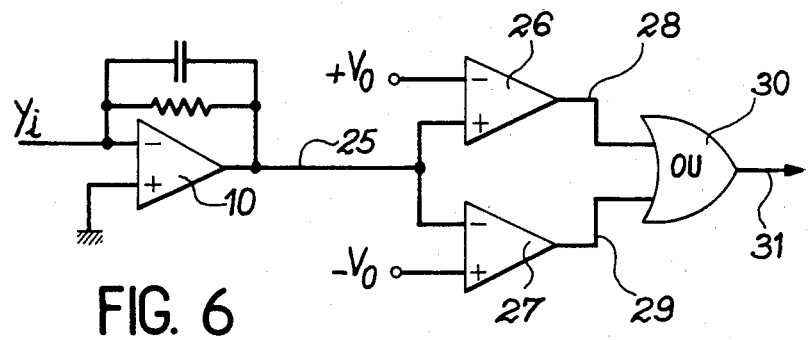
FIG. 6 the diagram of the electronic device for the suppression of high voltage interference with an amplitude above a given threshold.

FIG. 6 shows an apparatus according to the invention making it possible to overcome the harmful consequences of the appearance of a high voltage signal on one of the receiving lines $Y_i$ of a capacitive keyboard. Thus, interference of several thousand volts can be produced by electrostatic charges or by high voltage circuit breaking operations of the type found in the vicinity of trolley-bus lines or electric trains. Such high amplitude interference is dangerous for the electronics of the keyboard and can lead to undesired tripping or release operations. The apparatus of FIG. 6 makes it possible to obviate these risks in the following way. FIG. 6 shows a receiving line $Y_i$ connected, as in the two previous embodiments, to the negative input of an operational amplifier 10 connected in current integrator form and looped on itself by its RC-type negative feedback circuit 11. The signal at the output of amplifier 10 is supplied by a line 25 to the common input of two threshold circuits 26 and 27 connected in opposition and whereof circuit 26 is polarized to a voltage +Vo and circuit 27 to a voltage -31 Vo. Outputs 28 and 29 of threshold circuits 26 and 27 are connected to the input of an OR circuit 30 supplying at the output to line 31 a signal indicating the presence of interference with a positive or negative amplitude higher than Vo. The signal then present on line 31 can easily be used for keeping the keyboard release scanning electronics blocked for as long as this interference persists. In the prior art capacitive keyboard constructions, the normal signal present on line $Y_i$ is of about max. ±200 mv. In this case it is sufficient if the threshold circuits 26 and 27 are set to detect overshoots beyond about 1 V to obtain certainty that the voltages of this order of magnitude are due to the action of external electrical interference.

Figure 7:
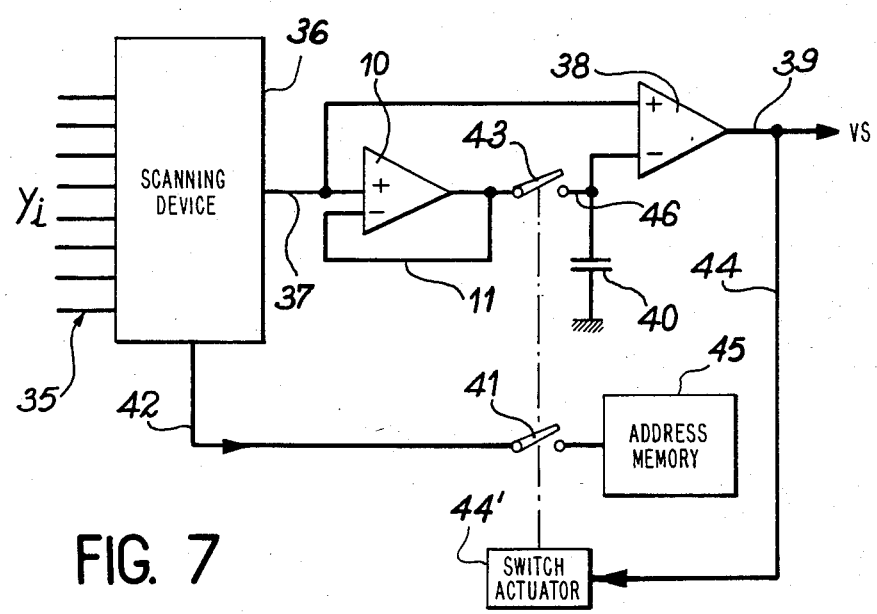
FIG. 7 the circuit diagram of the apparatus used for detecting the key supplying the highest signal from among several keys operated by a user.

FIG. 7 shows a diagram of an improved keyboard according to the invention enabling the investigation of the key supplying the highest signal at the time when a release order is received from the keyboard. This is important in all cases where a user has differently influenced several adjacent sensitive keys and it is necessary to know the user's precise intention. In this construction several receiving lines $Y_i$ enter at 35 into a sequential scanning device 36, which successively supplies to a line 37 the signals which may be present on the different receiving lines 35. The signal present on line 37 is passed into a voltage following operational amplifier assembly 10 provided with its negative feedback loop 11, as well as to a first input of a comparator 38 supplying a voltage Vs at output 39. The apparatus is completed by two memories, namely an analog memory 40 branched between earth and the second input of comparator 38 and an address memory 45 which, via a first switch 41 and a line 42 connected to the sequential scanning device 36, makes it possible to record the address of each of the sensitive keys on which a signal is noted. A second switch 43 makes it possible to connect the output of operational amplifier 10 and input 46 of comparator 38. The two switches 41 and 43 can operate simultaneously under the effect of an instruction received from output 39 of comparator 38 via line 44 applied to a switch actuator 44'.

The apparatus according to FIG. 7 functions in the following way. For each analyzed keyboard key, the electronic processing of the sequential scanning device 36 supplies on line 37 both a voltage proportional to the capacitance variation caused by the presence of a user's finger on the key in question, and the precise address of said key. The voltage value collected on the corresponding key is stored in analog form in memory 40 at the same time as its corresponding address in memory 45. On passing to the examination of the following key, comparator 38 is used for carrying out a comparison between the voltage stored in memory 40 for the preceding key and the new voltage being scanned. Comparator 38 establishes the difference and if the latter is positive, i.e. if there is a positive signal Vs on line 39, a transfer order is transmitted by comparator 38 on line 44 to switch actuator 44, which controls the closing of two switches 41 and 44 for storing the new voltage in memory 40 in place of the preceding voltage and for storing in memory 45 the new address of the sensitive key being scanned. When several keys have been successively analyzed in this way, it is certain that the key which supplied the highest amplitude signal has been detected, i.e. the signal which, with the maximum degree of probability, the user wished to operate.

Figure 8:
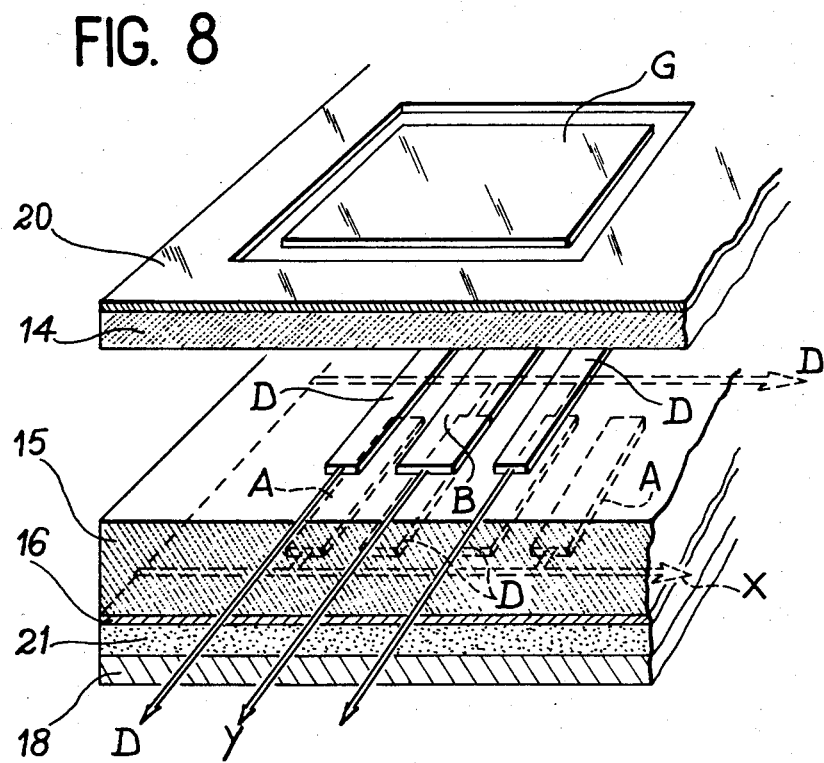
FIG. 8 a preferred embodiment of the interference-suppressed capacitive keyboard with two protective shields.

FIG. 8 shows in an exploded perspective view a preferred embodiment of the capacitive keyboard according to the invention. It can be seen that the keyboard comprises an upper insulating layer 14 and a lower insulating layer 15. Layer 14 has a protective conductive shield 20 around the sensitive keys G and is preferably transparent. The second layer 15 (or printed circuit) carries the various transmitting-receiving electrodes and separating electrodes distributed in the following manner. On the outer face of layer 15 are provided separating electrodes D associated with receiving electrode B and receiving lines $Y_i$. The electrodes D are intended to reduce the direct coupling between the electrodes A and B. The inner face of insulating layer 15 carries the transmitting electrodes A with transmitting line $X_j$ and a pair of separating electrodes D connected to a line D for the electrical connection of said electrodes. A label 16 is optionally placed beneath insulating layer 15 to indicate the function of key g. An insulating layer 21 and a conductive metal shield 18 earthed in the same way as shield 20 complete the structure in the downwards direction. Adhesion is used for assembling insulating layers 14 and 15, label 16, insulating layer 21 and shield 18.

In a structure according to FIG. 8, external interference can only penetrate via keys G, which considerably limits the possibility of entry for such interference. The combination of the effects of this structure with those of reference line 21 of FIG. 4 ensures an almost total protection against external interference, whilst giving an excellent signal-to-noise ratio.

What is claimed is:

1. An apparatus for the suppression of interference in a capacitive keyboard of the type including a series of sensitive keys on an outer surface accessible to a user, each key having a transmitting electrode excited by an alternating signal supplied by a transmitting line, and a receiving electrode selectively capacitively coupled to the transmitting electrode and connected to supply a receiving line, the receiving lines providing a corresponding set of unconditioned operating signals having amplitude variations dependent on the effect of the possible presence of the finger of a user on the sensitive key, said apparatus further comprising means for establishing the difference between the unconditioned operating signal from each receiving line and the signal from a reference line in the keyboard to supply a set of conditioned operating signals free from any unwanted electromagnetic component which has entered the keyboard, said means for establishing the difference including at least one subtractor into which signals from the receiving lines are passed.

2. Apparatus according to claim 1, wherein the reference line for each receiving line is another one of the receiving lines.

3. An apparatus according to claim 1, wherein the reference line is the output of an averaging circuit which determines the mean of a plurality of signals collected on several receiving lines.

4. An apparatus according to claim 2, wherein the reference line for each receiving line is an adjacent receiving line of a matrix structure.

5. Apparatus in accordance with claim 1, wherein the capacitive keyboard includes:

upper and lower insulating layers each having an outer face and an inner face, with the inner face of the upper insulating layer and the outer face of the lower insulating layer assembled to each other by adhesion;

the outer face of the upper insulating layer carrying the sensitive keys and an earthed conductive shield surrouding the sensitive keys;

the outer face of the lower insulating layer carrying the receiving electrodes and receiving lines, and carrying separating electrodes and supply lines for the separating electrodes; and the inner face of the lower insulating layer carrying the receiving electrodes and receiving lines, carrying separating electrodes, and carrying an earthed conductive shield separated by another insulating layer.

* * * * *